United States Patent [19]

Beck

[11] 4,426,571

[45] Jan. 17, 1984

[54] PORTABLE ELECTRIC HOT AIR REWORK TOOL FOR SOLDERING AND DESOLDERING PRINTED CIRCUIT ASSEMBLIES

[75] Inventor: Ronald A. Beck, Bloomington, Minn.
[73] Assignee: Sperry Corporation, New York, N.Y.
[21] Appl. No.: 417,241
[22] Filed: Sep. 13, 1982

Related U.S. Application Data

[63] Continuation of Ser. No. 160,899, Jun. 19, 1980, abandoned.
[51] Int. Cl.$^3$ .......................... B23K 3/04; H05B 3/00; H05K 3/34; F24H 3/04
[52] U.S. Cl. ..................................... 219/373; 34/202; 34/239; 34/243 R; 156/497; 165/85; 219/230; 219/367; 219/368; 219/379; 219/380; 228/20; 228/180 A; 228/242; 228/264
[58] Field of Search ............... 219/230, 367, 368, 374, 219/379-382, 373; 156/497; 228/19, 20, 51-55, 57, 180 A, 180 R, 264, 240, 242, 191; 34/202, 239, 243 R; 165/85

[56] References Cited

U.S. PATENT DOCUMENTS

| | | | |
|---|---|---|---|
| 1,991,734 | 2/1935 | Eaton | 219/380 |
| 2,609,477 | 9/1952 | Borda | 219/381 X |
| 2,997,098 | 8/1961 | Riese et al. | 156/497 |
| 3,402,089 | 9/1968 | Seaman | 219/373 X |
| 3,422,247 | 1/1969 | Royston et al. | 219/380 X |
| 3,466,838 | 9/1969 | Sorensen et al. | 156/497 X |
| 3,588,425 | 6/1971 | Erickson | 228/242 X |
| 3,722,072 | 3/1973 | Beyerlein | 228/180 A |
| 3,773,261 | 11/1973 | Helton | 219/230 X |
| 4,116,376 | 9/1978 | Delorme et al. | 228/180 A |
| 4,187,973 | 2/1980 | Fortune | 228/20 |
| 4,205,221 | 5/1980 | Meyer | 219/230 |
| 4,295,596 | 10/1981 | Dotem et al. | 228/264 X |

FOREIGN PATENT DOCUMENTS

| | | | |
|---|---|---|---|
| 548998 | 4/1932 | Fed. Rep. of Germany | 219/381 |
| 2925347 | 1/1981 | Fed. Rep. of Germany | 228/264 |
| 285692 | 5/1931 | Italy | 219/369 |
| 493258 | 10/1938 | United Kingdom | 219/373 |

OTHER PUBLICATIONS

"Nozzle for Reflow Soldering", F. Kristiansen; IBM Technical Disclosure Bulletin; vol. 11, No. 5; Oct. 1968, p. 482.
"Solder Reflow Tool", C. Trollman; IBM Technical Disclosure Bulletin, vol. 11, No. 10, Mar. 1969, p. 1298.
"Use of a Heated Gas Jet to Remove a Silicon Chip Soldered to a Substrate", K. S. Sacher et al., IBM Technical Disclosure Bulletin, vol. 20, No. 9, Feb. 1978, pp. 3725, 3726.
"Cleaning of Solder Pads Prior to a Rework Operation" K. Schink et al., IBM Technical Disclosure Bulletin, vol. 18, No. 5, Oct. 1975, pp. 1384, 1385.

Primary Examiner—A. Bartis
Attorney, Agent, or Firm—William C. Fuess; Kenneth T. Grace; Marshall M. Truex

[57] ABSTRACT

A portable electric hot air rework tool for directing a stream of turbulent hot air through removable and replaceable nozzles with a selectably sized orifice to predetermined size localized areas of a printed circuit assembly until a temperature sufficient to melt solder is achieved, thereby facilitating the soldering/desoldering of circuit components or parts of components mounted thereon. The apparatus essentially comprises a portable work station having upper and lower heat tubes, or plenums, through which a blower-forced stream of air made turbulent by turbulators with contra-pitched blades is directed, an adjustable support grid for supporting the pc assembly, within the directed air stream and a three-position switch for controlling the temperature and flow of the air in the heat tubes. An alignment positional indicator aids in precise location of the printed circuit assembly. The heat tubes are lined with refractory cement for electrical and thermal insulation, while the turbulators, heat tubes, and blower are electrically conductive and connnected metal for the removal of static electricity from the air stream. A heat sensitive lacquer is used to detect when the solder holding the component to the pc assembly has achieved a desired temperature and at which temperature the component can be removed or replaced. The heat tubes are provided with electric resistance heaters for heating the air stream directed through the nozzle and are lined with a refractory ceramic cement. The support grid is of sufficiently large grid size as to remain cool during operation with the assembly supported thereon.

10 Claims, 4 Drawing Figures

Fig. 2
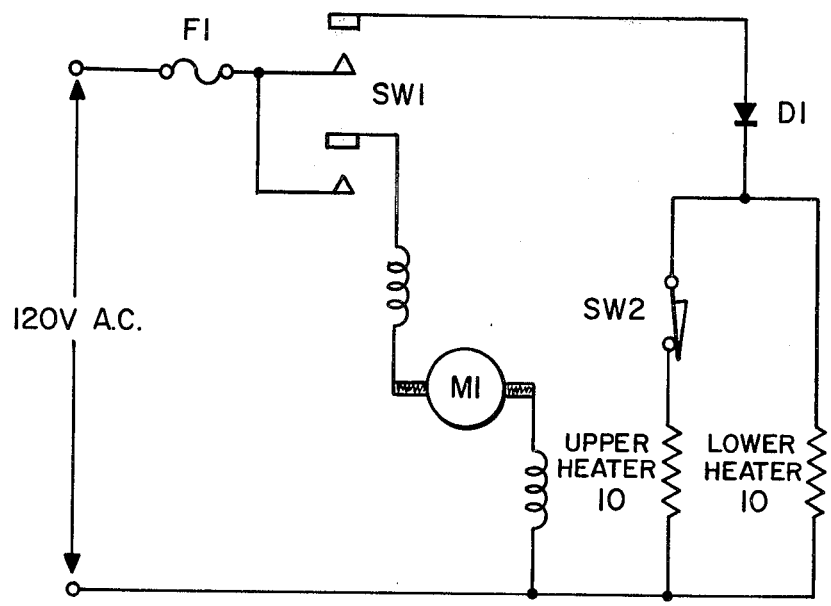
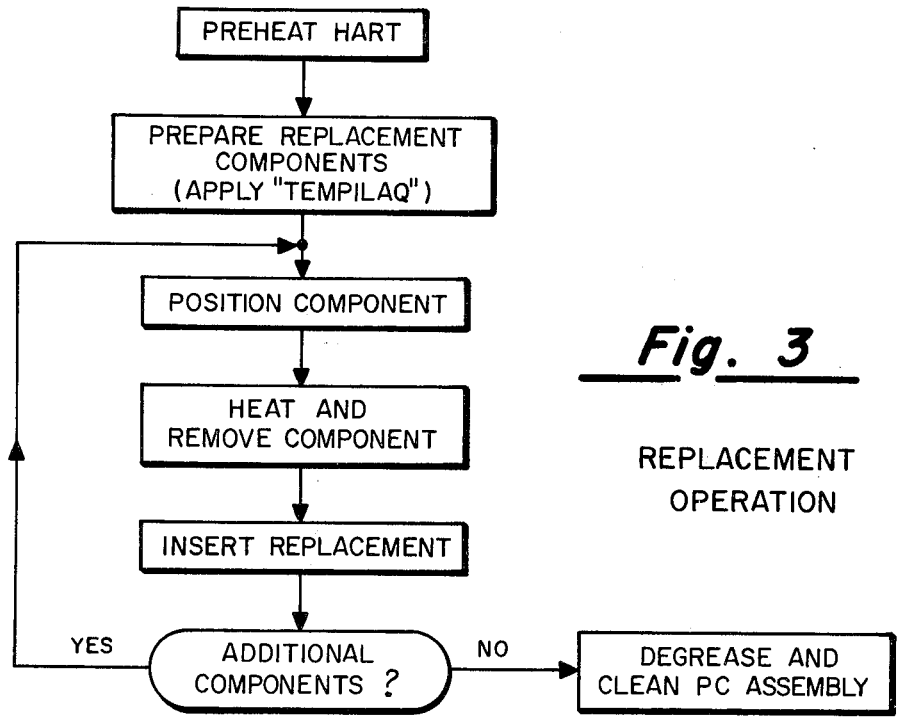
Fig. 3
REPLACEMENT OPERATION

PORTABLE ELECTRIC HOT AIR REWORK TOOL FOR SOLDERING AND DESOLDERING PRINTED CIRCUIT ASSEMBLIES

This is a continuation of application Ser. No. 160,899, filed June 19, 1980, now abandoned.

BACKGROUND OF THE INVENTION

The present invention relates to apparatus and a method for soldering/desoldering circuit components from a pc assembly. While the hot air rework tool (HART) has general applicability to any soldering-/desoldering situation, its greatest advantage to date has been in "field rework" situations requiring the removal-/installation of individual components (i.e., DIP's flat-packs, SSI, MSI and LSI integrated circuits) from a multilayer pc assembly at a customer site. For situations having multilayer pc assemblies of relatively few layers and/or components with relatively few pins, standard direct contact, resistance heating techniques can be used; but as the number of layers and pin counts increase so does the difficulty of the removal/installation operation. Primarily troublesome is the attendant heat sinking or spreading effect of the pc assembly, which effect requires higher heats. The higher heats in turn can damage the pc assembly by causing "measling" or delamination of the layers and/or the components.

While many devices exist that facilitate the soldering-/desoldering operation, from wave soldering to direct contact heat transfer devices, some of which further have suction means for removing molten solder and extractor means for holding a component and facilitating its removal or insertion, none of these devices have proven to be cost effective or amenable to the "field rework" situation, especially for relatively thick multi-layer pc assemblies. Prior to the development of the HART, components were generally removed using soldering irons and vacuum solder "gobblers." The process was relatively tedious though and required a variety of attachments to accomodate the various size packages and pin configurations encountered on the high density, multilayer pc assemblies.

The HART and method described herein however uses hot air as the primary heat transfer media and is adjustable to accomodate various size pc assemblies and components. The HART can heat either or both of the localized upper and lower surfaces of the pc assembly in the proximity of the desired component in either a concentrated or diffused manner, thereby creating a more uniform heat exchange environment which overcomes the heat spreading effects of the pc assembly. The HART also does away with the necessity of a solder suction device in that the air flow can more uniformly maintain the temperature of the solder in all the vias associated with a component so that all the pins can be inserted or removed without encountering any cold vias, which vias will not permit the component pin to be inserted or removed.

The present soldering/desoldering method is further improved by the application of a heat sensitive lacquer to the component or localized area during the solder-/desoldering operation, which lacquer will melt at a specific temperature and thus indicate that the component can be removed or a new component inserted.

SUMMARY OF INVENTION

Apparatus for directing a stream of hot air to impinge a circuit component and/or localized area of a substrate having components soldered thereto for removing or installing components from or onto the substrate. The apparatus comprises a primary air plenum to which an upper and lower air plenum are attached as well as a blower, a pc assembly support grid, control means, an orifice indicator and a base plate. Each of the upper and lower air plenums having heaters and turbulators contained therein for heating the air and producing a turbulent flow prior to directing the air from the plenum's associated orifice. The upper plenum also being adjustable inwardly or outwardly from said primary plenum; and further containing means for disconnecting the upper heater and substantially blocking the air flow through it when it is in a fully retracted position. The orifice indicator bracket being used to gauge where the lower orifice is with respect to a component or location that is positioned beneath the indicator.

Also, a solder/desolder method using the above apparatus whereby a heat sensitive lacquer having a known melting point (e.g. greater than or equal to the melting point of the solder) is placed on a component or at a location on the substrate; the hot air then being directed to impinge the component or location; and upon the melting of the lacquer, removing the component or adding a new component.

BRIEF DESCRIPTION OF THE DRAWINGS

FIG. 1a is a side view of the hot air rework tool with a lower air plenum shown in a partial cutaway section.

FIG. 1b is a cross-sectional view of the nozzle 12A or 12B, taken substantially along the line I—I of FIG. 1a.

FIG. 2 is a schematic diagram of the electrical wiring of the hot air rework tool.

FIG. 3 is a flow chart of the typical sequence of events that occur during a replacement operation.

DESCRIPTION OF THE PREFERRED EMBODIMENT

Figure 1:
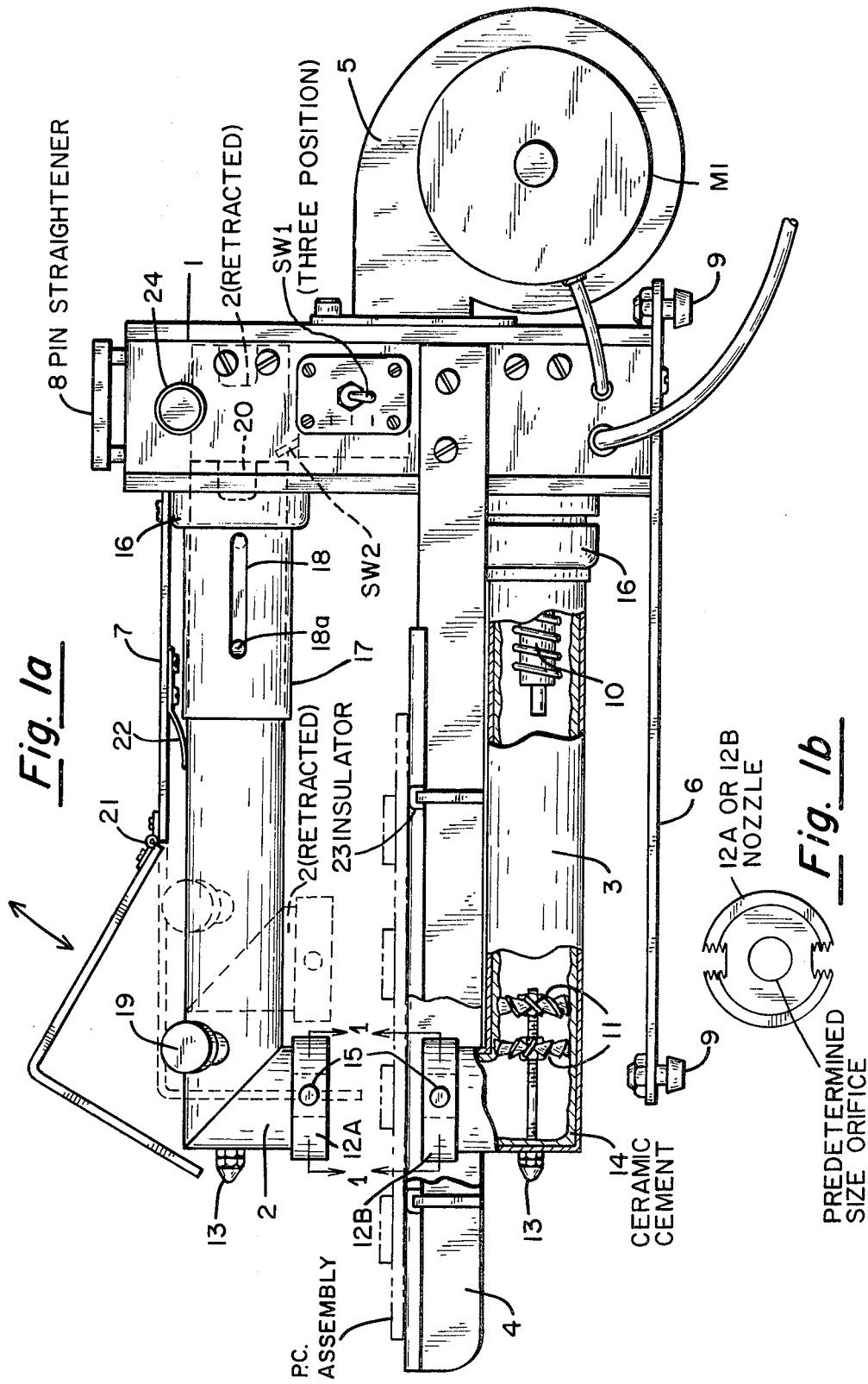

Referring to FIG. 1 the hot air rework tool (HART) is shown in a partially sectioned side view and will now be described with particular reference to its primary components. The method of use will then be described with reference to the flow chart of FIG. 3 and the typical sequence of steps that are recommended for the use of the HART. The HART is essentially comprised of a primary air plenum 1 to which are attached a retractable upper air plenum 2, a lower air plenum 3, a support grid 4, a blower 5, a base plate 6, an orifice indicator 7 and a pin straightener 8. The HART further is of a size such that with its appurtenant parts the entire unit can be placed within an attache case. The size and weight of the HART thus accommodates the typical field rework circumstances in which it finds its primary use. Referring now to the primary components each will be described in detail with respect to its appurtenant parts and the roles they play in the operation of the HART.

The primary plenum 1 essentially consists of a rectangular air cavity to which the blower 5 is attached and within which the control wiring (not shown) is affixed. It functions to distribute the air that is forced into it under a positive pressure via blower 5 into the upper plenum 2 and lower plenum 3. The primary plenum 1 is in turn attached to the base plate 6 which has four rubber cushioned legs 9 attached to it to prevent the HART from sliding on or marring a work surface upon which the HART is placed.

The blower 5 is positioned approximately midway between the upper plenum 2 and the lower plenum 3 such that the blown air is distributed evenly into the upper and lower air plenums 2 and 3. The air upon entering the upper and lower air plenums 2 and 3 passes over respective upper and lower resistance heating elements 10 (only one of which is shown but both of which typically are identical in size and heat rating) which are affixed to the primary plenum 1 within the center of the upper and lower air plenums 2 and 3. The air is then heated via heaters 10 to a temperature of approximately 600° to 650° Farenheit. Due to the positive pressure of the blower 5, the air is then forced to pass across the blades of the brass turbulators 11 (only the lower plenum's turbulators are shown) which are mounted within the upper and lower plenums 2 and 3 to cause a turbulent rather than a swirling or straight line air flow. A turbulent flow is preferred since a swirling or straight line flow can cause hot spots upon the exiting of the heated air from the orifices 12 of the upper and lower plenums 2 and 3. It should be noted that the blades of the turbulators 11 are positioned such that the pitches of the blades are contra to one another so that the turbulent flow rather than the swirling flow is created. It should also be noted that the turbulators 11 are constructed from brass and are secured to the upper and lower air plenums 2 and 3 via brass bolts 13 and thus act to also collect any static electricity that may be present in the heated air and conduct the static electricity to the chassis ground.

Upon reference to the cutaway sections of the lower air plenum 3, its associated turbulators 11 and heater 10 can be seen in their relative positions within the lower air plenum 3, but it is to be recognized that they are also similarly positioned within the upper air plenum 2. The upper and lower air plenums 2 and 3 are each also made from plated steel tubing and are coated on their interior surfaces with a refractory ceramic cement 14. The ceramic 14 acts to electrically insulate the metallic walls of the upper and lower air plenums 2 and 3 from the possible short-circuiting of the heaters 10 and also acts to partially insulate the metallic plenums 2 and 3 from the 600° to 650° Farenheit operating temperature to which the air is heated. It is also to be noted that additional ceramic 14 is placed at the outside 90° bend within the air plenums 2 and 3 to assist in directing the heated, turbulent air toward the selectable orifice members, or nozzles, 12, consisting of upper plenum arifice number 12A and lower plenum orifice member 12B. The hot turbulent air is then forced out of the upper and lower orifices 12 and directed onto the specific location or component on the pc assembly that is positioned between the upper and lower orifice members 12.

Each of the orifice members 12 is selected and correlated to have a size opening, or orifice, which is in accordance with the size of the circuit component or location of the pc assembly that is to be heated. In most applications, however, the size of the lower plenum orifice member 12B is usually selected to be larger than the component or area to be heated so as to diffuse the heat it generates over a larger area and thus create a relatively high ambient temperature at the component site, while the upper plenum orifice member 12A is selected to concentrate the heated air only to the circuit component or location. The upper and lower orifice member 12 can be replaced via the thumbscrews 15 which serve to affix the orifices 12 to the air plenums 2 and 3. The HART can thus accomodate varying sized circuit components and the varying packaging arrangements (i.e. plastic or ceramic) that are used in high and low density pc assemblies.

Referring now to the upper plenum 2, it too is connected to the primary plenum 1 by a connector assembly 16, but where the lower plenum 3 was directly connected by connector 16, the upper plenum 2 is connected via an upper sleeve 17 that is in turn connected to the primary plenum 1 by its connector 16 and which sleeve 17 has either one or two retractor slots 18 formed therein on opposite sides thereof (only one of which is shown), such that the upper plenum 2 can slide forward and backward within the sleeve 17. The forward travel of the upper plenum 2 being restricted by the stop scews 18a (only one of which is shown) and the reverse travel restricted by the inside back wall of the primary plenum 1. The travel of the upper plenum 2 is controlled by the knob 19 attached to the upper plenum 2 and which is formed from a heat insulating material so that the operator is not burned while extending or retracting the upper plenum 2. It is to be noted that in the fully retracted position when the upper plenum 2 abuts the inside back wall of the primary plenum 1, the notch 20, let into the side of the upper plenum 2, acts to permit only a restricted air flow to pass through the upper plenum 2. This condition, however, will be described more fully hereinafter with reference to FIG. 2 and the control circuitry.

Positioned immediately above the upper plenum 2 is the orifice indicator 7 which is shown in a partially raised and fully lowered position and which is used to indicate the center of the lower orifice member 12B when a pc assembly is placed on the support grid 4, since the lower orifice member 12B will be hidden in this situation. The indicator 7 is hinged by hinge 21 at the approximate center of the indicator 7 and enables the indicator 7 to be raised during the solder/desolder operation and lowered when a new component or location is being selected. Thus during the typical selection process, it is necessary for the operator to place the upper plenum 2 in its fully retracted position which enables the orifice indicator 7 to be lowered so as to align itself with the center of the lower orifice member 12B and which then allows the operator to select a specific component or location on the surface of the pc assembly and be assured that the center of the lower orifice member 12B is immediately beneath the tip of the indicator 7. The indicator 7 is then raised and the upper plenum 2 extended into its most forward position so that the center of the orifice member 12 are immediately above and below one another.

Also contained on the orifice indicator 7 is a ground spring 22 which is attached such that spring pressure is exerted against the upper air plenum 2 so as to make electrical contact with and ground any electrical charge which may collect on the upper plenum 2. The spring 22 is necessary in the case of the upper plenum 2 since the connector 16 essentially connects the sleeve 17 and not the upper plenum 2 itself to the primary plenum 1. Thus a positive chassis ground is insured for both the upper plenum 2 and upper sleeve 17 to the primary plenum 1.

Also attached to the primary plenum 1 is the support grid 4 which essentially provides a padded support surface for the pc assembly between the upper and lower orifices 12. The support grid 4 in the preferred embodiment is comprised of four intersecting rails of appropriate lengths to accommodate the various sizes of the typical pc assemblies encountered in the field operations and facilitate the rework of components which are positioned not only in the center of the pc assemblies but also on the edges. It should be noted that the rails of the support grid 4 are each covered with a nylon insulator 23 which ensures that the pc assembly is not damaged during rework. It should also be noted that the area circumscribed about the lower orifice member 12B by the intersecting rails of the support grid 4 should be sufficiently large so that the air which is deflected from the lower surface of a pc assembly does not cause the support grid 4 to become unduly hot, but yet sufficiently large so as to accommodate the smallest pc assembly that will be encountered.

Additionally, a pin straightener 8 is attached to the top of the primary plenum 1 which has a variety of component pin configurations let into it so as to enable the operator to plug individual circuit components into it prior to insertion in the pc assembly and thereby straighten and realign all the pins of the circuit component. Such a straightening operation becomes very critical when the pin count per package is high, such as in the case of 64 or 128 pin packages. In these cases the misalignment of one or more pins can make it very difficult to insert the component into a new location or a replacement location.

Referring now to FIG. 2 the control circuitry for the HART will be described. The HART operates from a 120 volt, single phase AC supply which is fused on its positive side by fuse F1 (not shown in FIG. I) which is contained in fuseholder 24. The power is then controlled by the double-pole/three position switch SW1 which supplies the power to the windings of the blower motor M1 and the respective upper and lower heaters 10. The switch SW1 is a three position switch having an "off," "cold," and "hot" position. The "cold" position corresponds to only the blower 5 (i.e. motor M1) operating and the "hot" position corresponds to the blower 5 and the upper and lower heaters 10 operating. A diode D1 (not shown in FIG. 1) is also provided to partially rectify the AC power that is supplied to the heaters 10.

Also included is a single pole/single throw limit switch SW2 (shown in dashed line in FIG. I) which is wired in series between diode D1 and the upper heater 10. The switch SW2 is positioned within the primary plenum 1 such that anytime the upper plenum 2 is partially retracted, the plenum 2 engages the actuator assembly of the switch SW2 causing its contacts to open and disconnect the power to the upper heater 10. Thus when the upper plenum 2 is retracted, only cool air is blown through the upper plenum 2. It should be recalled that when the upper plenum 2 is fully retracted the air flow is also substantially restricted by the notch 20. Thus in the fully retracted position, the restricted air flow in the upper plenum 2 acts to minimize the likelihood of the operator being burned, should he touch the upper plenum 2 as he positions the pc assembly, and to prevent the inadvertent heating of undesired components. It should also be recognized because the lower heater 10 is directly coupled between the switch SW1, the lower heater 10 will always be "on" so long as the switch SW1 is in the "hot" position. Consequently the lower plenum 3 will continue to provide hot air while the pc assembly is repositioned, unless switch SW1 is switched to its "cold" or "off" position or unless an additional switch is placed in series with the lower heater 10.

The method employed in using the HART will now be described with reference to the flow chart of FIG. 3 and the typical sequence of events that occur during a normal component replacement operation. Prior to using the HART, it is initially preheated by placing the switch SW1 in the "hot" position while the upper plenum 2 is fully extended for approximately three to four minutes. And while waiting for the HART to heat up to its operating temperature, the operator prepares the replacement components, as necessary, by using the pin straightener 8 to straighten and align the pins of the replacement components; applying a suitable solder flux to the pins, if needed to insure a good solder connection; loading the insertion tool with the desired replacement component to facilitate the insertion of the replacement component; and/or coating the components to be removed with a temperature sensitive lacquer.

Upon preheating, the switch SW1 is then switched to its "off" position and the upper plenum 2 is retracted. The operator can then center the desired component over the lower orifice member 12B with the aid of the orifice indicator 7. After positioning the desired component over the lower orifice member 12B, the movable portion of the orifice indicator 7 is then folded up and out of the way; the upper plenum 2 is extended so that the upper orifice member 12A is centered immediately above the desired component; and the switch SW1 is switched to the "hot" position which causes the upper and lower heaters 10 to turn on and again heat the air flow that is again being forced by the blower 5 through the upper and lower plenums 2 and 3.

During the removal or insertion step the HART thus subjects the component to a heat of approximately 600° to 650° Farenheit with the upper plenum's heat being concentrated on the component while the lower plenum's heat is spread over a slightly larger area. In this manner the ambient temperature around the selected component is raised, while the heat on the upper surface of the component is concentrated and transferred by the component's package to the individual pins, since the package and pins are relatively good heat conductors, especially in ceramic packages. The localized heating of the component's pins thus causes the solder surrounding each of the pins in their associated vias to melt so that removal can be accomplished.

It is to be recognized, however, that while the use of the HART is being described in a process for removing entire components, it can also be used to remove portions of components, such as in those cases where the components are fabricated using bump soldering or hybrid techniques. In these cases though the heat from the upper plenum 2 is critical and is used to heat the integrated circuit die, not the pins, while the component's cover is removed. For the typical component though, the internal connections are made using lead bonding techniques, which require a heat of 1100° to 1200° Farenheit, and thus the internal connections are unaffected by the HART's 600° to 650° Farenheit temperatures.

The above removal process is further facilitated by the use of the previously mentioned heat sensitive lacquer, which typically comprises a 400° Farenheit Tempilaq (manufactured by the Tempil Corporation) and which typically is applied to the upper surface of the component. Thus upon the localized heating of the lacquer and the component with the HART, the lacquer will melt when it reaches its 400° Farenheit melting point which indicates the relative temperature of the solder in the vias of the pc assembly and which minimizes the duration of exposure and amount of heat applied to the component. Upon the melting of the lacquer, the operator should then rock the component slightly to determine that the solder surrounding all of the pins has melted sufficiently, and upon this assurance or with slightly more heating time, the operator can remove the component. It should be noted that the typical removal operation according to the above described process takes two to three minutes but that more may be required for large components.

During the removal of the old component, the upper plenum 2 is fully retracted; but subsequent to removal, it is then generally returned to its fully extended position so as to maintain the temperature of the solder in the vias where the new component will be inserted. When the operator is ready to insert the new replacement component, the upper plenum 2 is again retracted and the component is inserted into the vias. If the solder is not sufficiently pliable, the component can be placed above the vias and the upper plenum 2 again extended so as to heat the component and reheat the vias, and upon reheating, the component should fall into place, if all the pins are properly aligned. Additional solder and flux can also be added at this time as necessary.

After replacement of a component, the switch SW1 is switched to the "cool" or "off" position and the pc assembly either removed or repositioned but only after the operator is sure that the solder connections have solidified.

The above described operation is then repeated for each of the identified components until all rework is completed. Upon completion, the upper plenum 2 is returned to its fully extended position and switch SW1 is turned to its "cool" position to allow the upper and lower plenums 2 and 3 to cool. During this time the pc assembly can then be cleaned to remove reflux or other contaminants which might adhere to it from the rework process.

While the HART and its method of operation have been described with reference to the preferred embodiment, it is to be recognized that the individual components of the design can be changed in any number of manners without departing from the spirit and scope of the claims hereinafter set forth. Some possible changes might be to include a clamping means to the base plate 6 whereby the HART can be clamped to a work table if space allows. One may also desire to use different variations of the heaters 10 such as a larger element so as to provide a different heating rate. One may desire to make both the upper and lower plenums 2 and 3 retractable so as to accommodate greater size variations in pc assemblies and also make the HART easier to package and carry. One might further desire to change the knob 19 to provide a pulley arrangement for retracting and extending the upper plenum 2 so as to minimize the likelihood of the operator contacting the heated upper plenum 2. One may still further desire to vary the control wiring to accommodate different circumstances. But, it is to be recognized that each of these aforementioned variations are mere variations of the described invention and they should not detract from the spirit and scope of the claimed invention.

What is claimed is:

1. A soldering apparatus using hot air as a primary heat transfer media which controllably localizes the area of heating upon a workpiece, said solder apparatus comprising:

plenum means for confining and directing air flow from a means for producing said air flow to an air flow output end;

blower means attached to said plenum means for producing said air flow;

heater means within said plenum means for heating said air flow in said plenum means to a temperature at said air flow output end sufficient to cause solder to melt;

a removable and replaceable orifice member means with a selected predetermined size orifice for occluding said air flow output end of said plenum means and for, by said occluding at said selected predetermined size orifice, concentrating the hot air flow to a correspondingly predetermined size localized substrate area upon said workpiece; and support grid means closely proximate to and for supporting a workpiece substrate with respect to said air flow output end of said plenum means such that said hot air flow thereof impinges either a component or components soldered to the workpiece substrate, or a localized area of the workpiece substrate where a component or components is to be added, or a portion of a component which is itself solderably fabricated and also soldered to the workpiece substrate;

wherein a soldered component or components can respectively be removed from the workpiece substrate, or a new component or components can be added thereto the workpiece substrate, or a solderably fabricated component may be disassembled or assembled while soldered thereupon the workpiece substrate;

wherein said support grid means closely proximate to said workpiece substrate upon which said component or components are soldered is also heated by said hot air flow, but which support grid means is of sufficient large grid size so as to remain sufficiently cool so as not to itself become soldered to said workpiece substrate, while remaining fully enabled for said supporting;

wherein said predetermined size localized area of heating upon the workpiece via said removable and replaceable orifice member means with predetermined size orifice means occluding said hot air flow is thusly at size of plural components, a component or a portion of a component;

wherein selective soldered components can be selectably desoldered from the workpiece substrate or selective new components soldered thereto.

2. A soldering apparatus using hot air as a primary heat transfer media which controllaby localizes the area of heating upon a workpiece, said solder apparatus comprising:

plenum means for confining and directing air flow from a means for producing said air flow to an air flow output end;

blower means attached to said plenum means for producing said air flow;

turbulent air flow inducing means within said plenum means for inducing turbulence via contra-pitched blades to said hot air flow at said air flow output end;

heater means within said plenum means for heating said air flow in said plenum means to a temperature at said air flow output end sufficient to cause solder to melt;

a removable and replaceable orifice member means with a selected predetermined size orifice for occluding said air flow output end of said plenum means and for, by said occluding at said selected predetermined size orifice, concentrating the hot air flow to a correspondingly predetermined size localized substrate area upon said workpiece; and means for supporting a workpiece substrate with respect to said air flow output end of said plenum means such that said hot air flow thereof impinges either a component or components soldered to the workpiece substrate, or a localized area of the workpiece substrate where a component or components is to be added, or a portion of a component which is itself solderably fabricated and also soldered to the workpiece substrate, wherein hot spots within said hot air flow as impinges said predetermined size localized substrate area may be substantially eliminated;

wherein a soldered component or components can respectively be removed from the workpiece substrate, or a new component or components can be added thereto the workpiece substrate, or a solderably fabricated component may be disassembled or assembled while soldered thereupon the workpiece substrate;

wherein said predetermined size localized area of heating upon the workpiece via said removable and replaceable orifice member means with predetermined orifice means occluding said hot air flow is thusly at size of plural components, a component or a portion of a component;

wherein selective soldered components can be selectably desoldered from the workpiece substrate or selective new components soldered thereto.

3. The soldering apparatus of claim 2 wherein said plenum means further comprises:

plenum means consisting of a first and a second plenum each for confining and directing air flow between a respective means for producing said air and a respective air flow output end; and wherein said blower means further comprises:

blower means attached to said plenum means for producing said air flow within each said first and said second plenums;

and wherein said heater means further comprises:

heater means within each said first and said second plenums for heating said air flow in said plenum means to a temperature sufficient to cause solder to melt;

and wherein said removable and replaceable orifice member means further comprises:

removable and replaceable orifice member means consisting of a first orifice member and a second orifice member, each which said first and said second orifice members is independently possessed of a selected predetermined size orifice, for respectively occluding said air flow output ends of respective said first and said second plenums and for, by said occluding at respective said air flow output ends of said first first and said second plenums, respectively concentrating said hot air flow from respective said first and said second plenums to respective predetermined size localized substrate areas upon said workpiece;

and wherein said means for supporting a workpiece substrate further comprises:

means for supporting a workpiece substrate with respect to said air flow output end of each said first and said second plenums so that said hot air flow from each said first and second plenums impinges said respective predetermined size localized substrate areas which are substantially juxtaposed upon opposite sides of said workpiece;

and wherein said turbulent air flow inducing means further comprises:

turbulent air flow inducing means within each said first and said second plenums for inducing turbulence within said hot air flow at said air flow output end of each said first and said second plenums;

wherein by said juxtaposition of said predetermined size localized areas of heating upon opposite sides of said substrate workpiece various combinations of said predetermined size localized areas heated, and thusly of the combined areas thermal profile of heated said workpiece substrate, are possible;

wherein by said juxtaposed predetermined size localized areas of heating one such said predetermined size localized area could be minimally sized for concentration of heating while the other such predetermined size localized area could be of larger size for ambient heating of an area of components, a component, or a portion of a component.

4. The soldering apparatus of claim 2 wherein said plenum means further comprise:

plenum means which are electrically conductive;

and wherein said turbulent air flow inducing means further comprise:

metal air flow turbulence inducing means within and electrically conductively connected to said plenum means for inducing turbulence within said hot air flow at said hot air flow output end, and for collecting and conducting to said plenum means any static electricity which may be present in said hot air flow.

5. Soldering apparatus as set forth in claim 3 wherein at least one of said first and said second air plenums is movable and including means for independently controlling the movement of the movable ones of said first and second air plenums with respect to the other of said first and second air plenums and also with respect to said workpiece.

6. Soldering apparatus as set forth in claim 5 including means for indicating the relative position of the air flow output end of one of said air plenums with respect to the center of the orifice member means at the air flow output end of the other of said air plenums, wherein the air flow output of said first and second air plenums can be positioned directly in line with each other so as to impinge juxtaposed opposite areas of said workpiece substrate.

7. Soldering apparatus as set forth in claim 5 wherein said at least one movable air plenum is enabled for disconnection of said heater means within said plenum and for blockage of said confined and directed air flow from said air flow output end when said at least one movable plenum is moved to a position wherein said air flow output of said at least one movable air plenum is not positioned directly in line with, but is rather positioned remotely from, the air flow output of the other one of said air plenums.

8. Soldering apparatus as set forth in claim 3 including means for disconnecting said heater means within either said first air plenum or within said second air plenum wherein such plenum air flow is then relatively cool, unheated, air flow.

9. The soldering apparatus of claim 3 wherein said plenum means further comprise:
metal plenum means, lined with refractory ceramic cement for electrical and thermal insulating purposes, for confining and directing air flow.

10. The soldering apparatus of claim 9 wherein said blower means further comprises:
electrically conductive metal blower means;
and wherein said metal plenum means further comprises:
metal plenum means electrically conductive to said blower means, and to said means for supporting a workpiece substrate, for the grounding of electrical charge.

* * * * *